United States Patent
Wang et al.

(10) Patent No.: US 8,363,437 B2
(45) Date of Patent: Jan. 29, 2013

(54) UNIDIRECTIONAL MOSFET AND APPLICATIONS THEREOF

(75) Inventors: Chih-Liang Wang, Keelung (TW); Ching-Sheng Yu, Wugu Township, Taipei County (TW); Po-Tai Wong, Keelung (TW)

(73) Assignees: GlacialTech, Inc., Jhonghe, Taipei County (TW); Chih-Liang Wang, Keelung (TW)

( * ) Notice: Subject to any disclaimer, the term of this patent is extended or adjusted under 35 U.S.C. 154(b) by 741 days.

(21) Appl. No.: 12/554,545

(22) Filed: Sep. 4, 2009

(65) Prior Publication Data
US 2010/0067275 A1 Mar. 18, 2010

(30) Foreign Application Priority Data
Sep. 12, 2008 (TW) .............................. 97135084 A

(51) Int. Cl.
*H02H 7/125* (2006.01)
(52) U.S. Cl. ........................................................ 363/53
(58) Field of Classification Search .................... 363/50, 363/52, 53, 125, 127; 327/419, 574, 581
See application file for complete search history.

(56) References Cited

U.S. PATENT DOCUMENTS

| 7,352,202 B2 * | 4/2008 | Billingsley et al. ...... 324/754.05 |
| 7,741,894 B2 * | 6/2010 | Kojima ........................ 327/427 |

* cited by examiner

*Primary Examiner* — Matthew Nguyen
(74) *Attorney, Agent, or Firm* — Muncy, Geissler, Olds & Lowe, PLLC

(57) ABSTRACT

Owing to the property of bidirectional conduction under the saturation mode, synchronous rectifiers in conventional power converters usually suffer from a reverse current under light loads or a shoot-through current under heavy loads. The reverse current may degrade the converter efficiency and the shoot-through current may damage synchronous rectifiers. The present invention discloses a unidirectional metal oxide semiconductor field effect transistor (UMOS), which comprises a metal oxide semiconductor field effect transistor (MOS), a current detection circuit and a fast turn-off circuit. The current detection circuit detects the direction of the current flowing through the MOS. When a forward current is detected, the fast turn-off circuit is disabled and the channel of the MOS can be formed. When a reverse current is detected, the fast turn-off circuit is enabled and the channel of the MOS cannot be formed. This UMOS can be applied, but not limited, to synchronous rectifiers to detect the occurrence of a reverse current or a shoot-through current and fast turn off the channel of the MOSFET.

9 Claims, 9 Drawing Sheets

UNIDIRECTIONAL MOSFET AND APPLICATIONS THEREOF

BACKGROUND OF THE INVENTION

1. Field of the Invention

The present invention discloses a unidirectional MOSFET and applications thereof.

2. Description of the Related Art

The N-channel MOSFET (NMOS) is often used as self-driven synchronous rectifiers to realize power converters with low cost and high efficiency. When used as a power switch, an NMOS has two operation modes: (1) cutoff mode: when $v_{GS}(t)<V_{GS(th)}$, the channel cannot be formed; $i_D(t)$ cannot flow through the channel; (2) saturation mode: when $v_{GS}(t) \geqq V_{GS(th)}$, the channel can be formed; $i_D(t)$ can flow from drain to source or from source to drain through the channel, where $v_{GS}(t)$ is the gate-source voltage; $V_{GS(th)}$ is the gate-source threshold voltage; and $i_D(t)$ is the drain current.

Due to the property of bidirectional conduction under the saturation mode, a synchronous rectifier realized with an NMOS usually suffers from a reverse current under light loads or a shoot-through current under heavy loads. The reverse current may degrade the converter efficiency and the shoot-through current may damage the synchronous rectifier. To illustrate the cause and effect of the shoot-through current, a flyback converter with a self-driven synchronous rectifier is taken as an example. If the flyback converter operates under the continuous conduction mode (CCM), and a cross conduction exists between the primary power switch and the secondary self-driven synchronous rectifier, the drain-source voltage divided by the small channel resistance will lead to a huge shoot-through current, which may damage the synchronous rectifier.

To solve the above problems, the present invention discloses a unidirectional MOSFET and its applications in synchronous rectifiers to detect the occurrence of a reverse current or a shoot-through current and fast turn off the channel of the MOSFET.

SUMMARY OF THE INVENTION

A unidirectional MOSFET includes a MOSFET, a current detection circuit and a fast turn-off circuit. The MOSFET may be an N-channel MOSFET or a P-channel MOSFET. The current detection circuit detects the direction of the current flowing through the MOSFET. When a forward current is detected, the fast turn-off circuit is disabled so that the channel of the MOSFET can be formed. When a reverse current is detected, the fast turn-off circuit is enabled so that the channel of the MOSFET cannot be formed. Such a unidirectional MOSFET may be but not limited to applications in synchronous rectifiers to detect the occurrence of a reverse current or a shoot-through current and fast turn off the channel of the MOSFET.

BRIEF DESCRIPTION OF THE DRAWINGS

The objectives, technical contents and characteristics of the present invention can be more fully understood by reading the detailed description of the preferred embodiments in company with the attached drawings, wherein.

DETAILED DESCRIPTION OF THE INVENTION

Figure 1A:
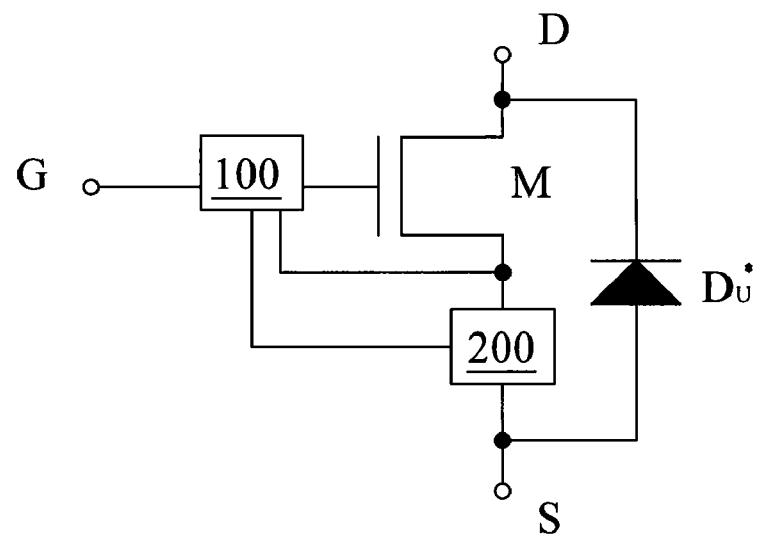
FIG. 1A and FIG. 1B are the functional block diagrams of unidirectional MOSFETs.
Figure 1B:
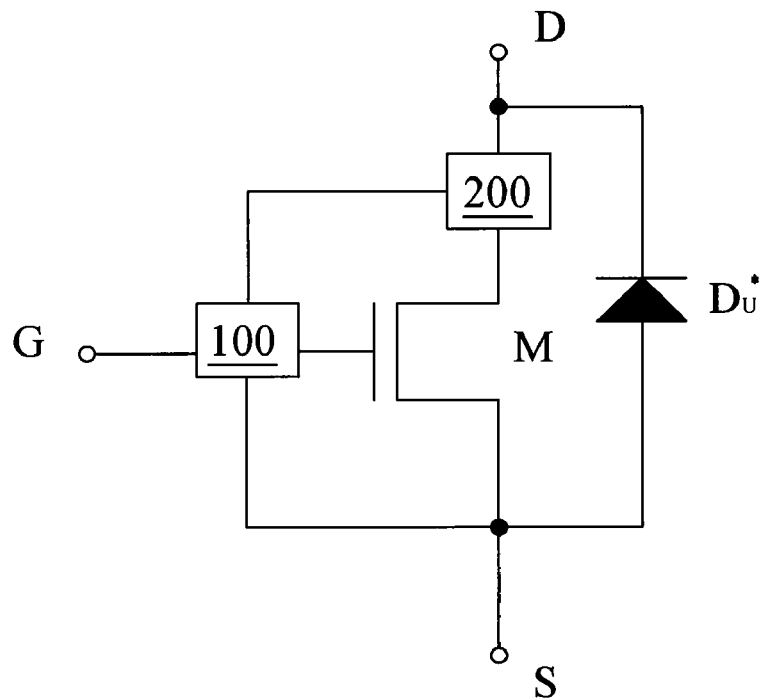

As shown in FIG. 1A and FIG. 1B, a unidirectional MOSFET (UMOS) includes a pan-gate G, a pan-drain D, a pan-source S, a MOSFET M, a current detection circuit 200, and a fast turn-off circuit 100. The MOSFET M includes a gate, a drain and a source. The current detection circuit 200 includes a first input, a second input and an output. The fast turn-off circuit 100 includes a first input, a second input, a first output and a second output.

The MOSFET M may be an N-channel MOSFET (NMOS) or a P-channel MOSFET (PMOS). For the convenience of illustration, the MOSEFT M is assumed to be an NMOS herein. However, it is emphatically noted that the MOSFET M in the present invention can be but not limited to an NMOS.

The current detection circuit 200 is used for detecting the direction of the current flowing through the MOSFET M. The detection method may be a pan-source detection (FIG. 1A) or a pan-drain detection (FIG. 1B). In FIG. 1A, the first input and the second input of the current detection circuit 200 are respectively connected to the pan-source S and the source of the MOSFET M. In FIG. 1B, the first input and the second input of the current detection circuit 200 are respectively connected to the drain of the MOSFET M and the pan-drain D.

The fast turn-off circuit 100 receives an output signal from the current detection circuit 200 and a control signal from an external driving circuit to turn on or turn off the channel of the MOSFET M. The first input, the second input, the first output and the second output of the fast turn-off circuit 100 are respectively connected to the output of the current detection circuit 200, the pan-gate G, the gate and the source of the MOSFET M.

The channel between the drain and the source of the MOSFET M is controlled by the voltage difference between the pan-gate G and the pan-source S, the output signal of the current detection circuit 200 and the output signal of the fast turn-off circuit 100. When a forward current (from the pan-source S to the pan-drain D) is detected, the fast turn-off circuit 100 is disabled; the channel of the MOSFET M can be formed. When a reverse current (from the pan-drain D to the pan-source S) is detected, the fast turn-off circuit 100 is enabled; the channel of the MOSFET M cannot be formed.

Moreover, an enhanced UMOS (e-UMOS), which includes a UMOS and an extra diode $D^*_U$ with a lower forward voltage drop, whose anode and cathode are respectively connected to the pan-source S and the pan-drain D (NMOS) or the pan-drain D and the pan-source S (PMOS), can further reduce the body diode conduction loss of the MOSFET M in specific applications.

Figure 2A:
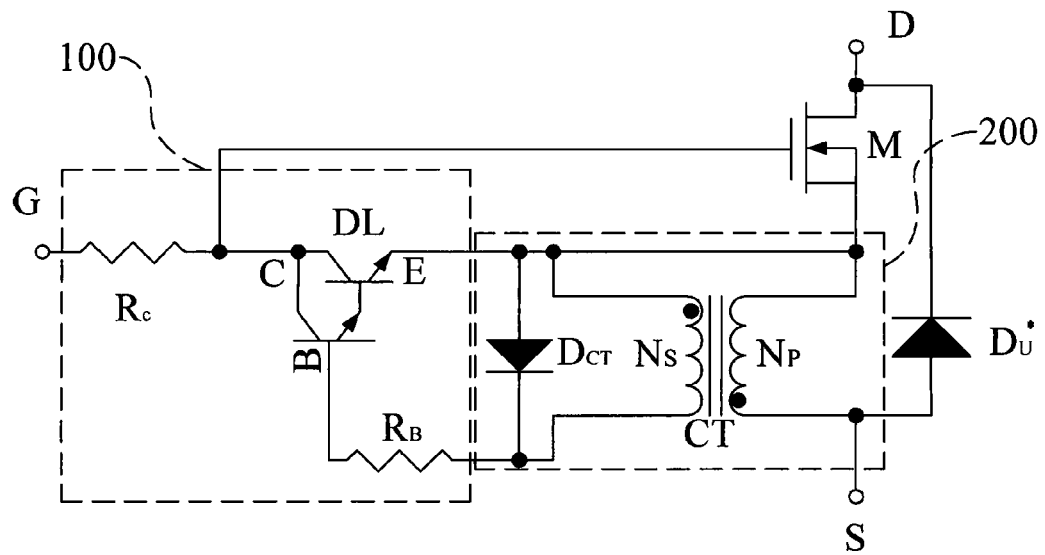
FIG. 2A and FIG. 2B are respectively the actual circuit diagrams corresponding to FIG. 1A and FIG. 1B.
Figure 2B:
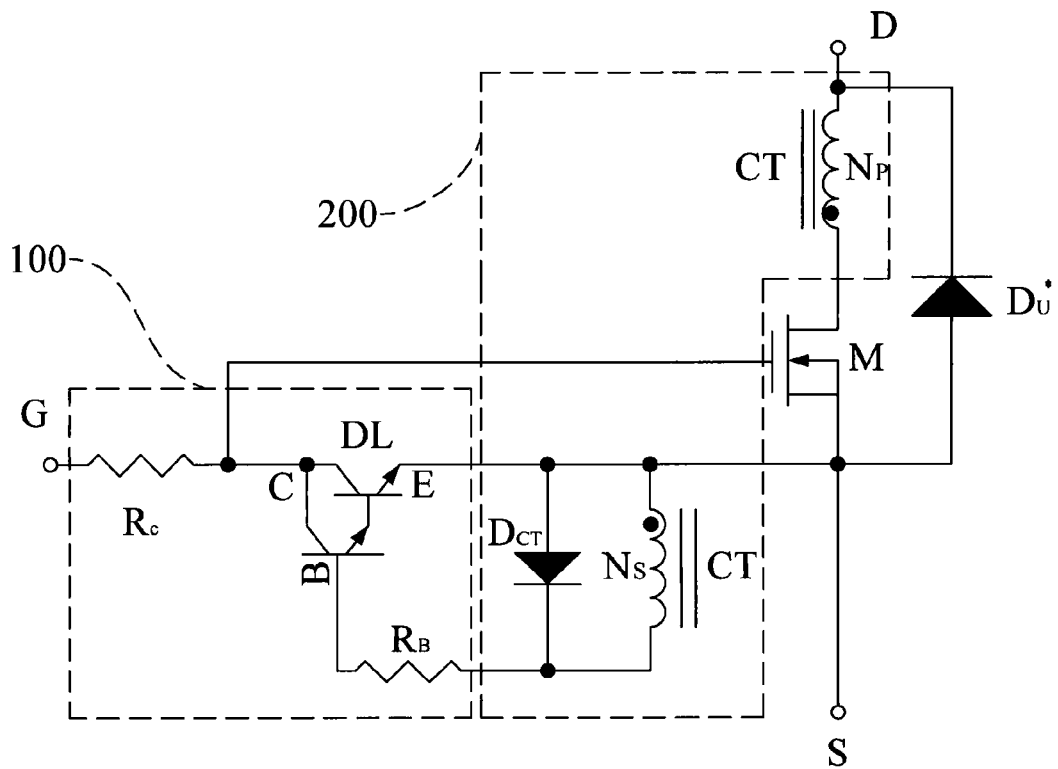

FIG. 2A and FIG. 2B, where an NMOS is used for the MOSFET M, are two embodiments respectively corresponding to FIG. 1A and FIG. 1B. The current detection circuit 200 is realized by a current transformer CT and a diode $D_{CT}$. The current transformer CT includes a primary winding $N_P$ and a secondary winding $N_S$; black dots denote that the dotted terminals are of the same polarity. For the convenience of illustration, the black-dotted terminal and the other terminal are respectively called a positive pole and a negative pole. The first input, the second input and the output of the current detection circuit 200 are respectively the positive pole of the primary winding $N_P$, the negative pole of the primary winding $N_P$ and the negative pole of the secondary winding $N_S$. The primary winding $N_P$ and the MOSFET M are connected in series to detect the direction of the current flowing through the MOSFET M. In FIG. 2A, the positive and negative poles of the primary winding $N_P$ are respectively connected to the pan-source S and the source of the MOSFET M. In FIG. 2B, the positive and negative poles of the primary winding $N_P$ are respectively connected to the drain of the MOSFET M and the pan-drain D. The secondary winding $N_S$ and the diode $D_{CT}$ are connected in parallel to disable or enable the fast turn-off circuit 100. The positive and negative poles of the secondary winding $N_S$ are respectively connected to the anode and cathode of the diode $D_{CT}$.

The fast turn-off circuit 100 includes a Darlington transistor DL, a resistor $R_B$ and a resistor $R_C$. The Darlington transistor DL is equivalent to two NPN bipolar junction transistors in cascade. The base B of the Darlington transistor DL is connected to one terminal of the base resistor $R_B$. The collector C of the Darlington transistor DL is connected to one terminal of the collector resistor $R_C$ and the gate of the MOSFET M. The emitter E of the Darlington transistor DL is connected to the anode of the diode $D_{CT}$, the positive pole of the secondary winding $N_S$ and the source of the MOSFET M. The other terminal of the base resistor $R_B$ is connected to the cathode of the diode $D_{CT}$ and the negative pole of the secondary winding $N_S$. The other terminal of the collector resistor $R_C$ is connected to the pan-gate G. The first input, the second input, the first output, and the second output of the fast turn-off circuit 100 are respectively the other terminal of the base resistor $R_B$, the other terminal of the collector resistor $R_C$, the collector C of the Darlington transistor DL and the emitter E of the Darlington transistor DL.

If the current detected by the current transformer CT is $i_D(t)$, the discharging current of the Darlington transistor DL is $$\frac{h_{FE} i_D(t)}{n},$$

where $h_{FE}=\beta^2$, with $\beta$ being the current gain of an individual NPN bipolar junction transistor, is the current gain of the Darlington transistor DL, and $$n = \frac{N_S}{N_P}$$

is the secondary-to-primary turns ratio of the current transformer CT. Assuming that n=50, $i_{B(sat)}$=0.1 mA and $h_{FE}$=10000, the maximum allowable reverse current or shoot-through current is $i_{D(st),max}$=0.5 μA. In other words, a very small reverse current is enough to saturate the Darlington transistor DL and cut off the channel of the MOSFET M.

When a forward current $i_D(t)$ flows into the positive pole of the primary winding $N_P$, a current $$\frac{i_D(t)}{n}$$

induced by the secondary winding $N_S$ flows out of the positive pole of the secondary winding $N_S$ and conducts the diode $D_{CT}$; the Darlington transistor DL is reverse-biased and turned off; the channel of the MOSFET M can be formed by $v_{GS}(t) \geq V_{GS(th)}$; $i_D(t)$ can flow from source to drain through the channel of the MOSFET M.

When a reverse current $i_D(t)$ flows out of the positive pole of the primary winding $N_P$, a current $$\frac{i_D(t)}{n}$$

induced by the secondary winding $N_S$ flows into the positive pole of the secondary winding $N_S$ and saturates the Darlington transistor DL; the diode $D_{CT}$ is reverse-biased and turned off; the gate-source voltage of the MOSFET M is equal to the collector-emitter saturation voltage of the Darlington transistor DL and is less than the gate-source threshold voltage of the MOSFET M, i.e. $v_{GS}=V_{CE(sat)}<V_{GS(th)}$; the channel of the MOSFET M cannot be formed; $i_D(t)$ cannot flow from drain to source through the channel of the MOSFET M.

Figure 3:
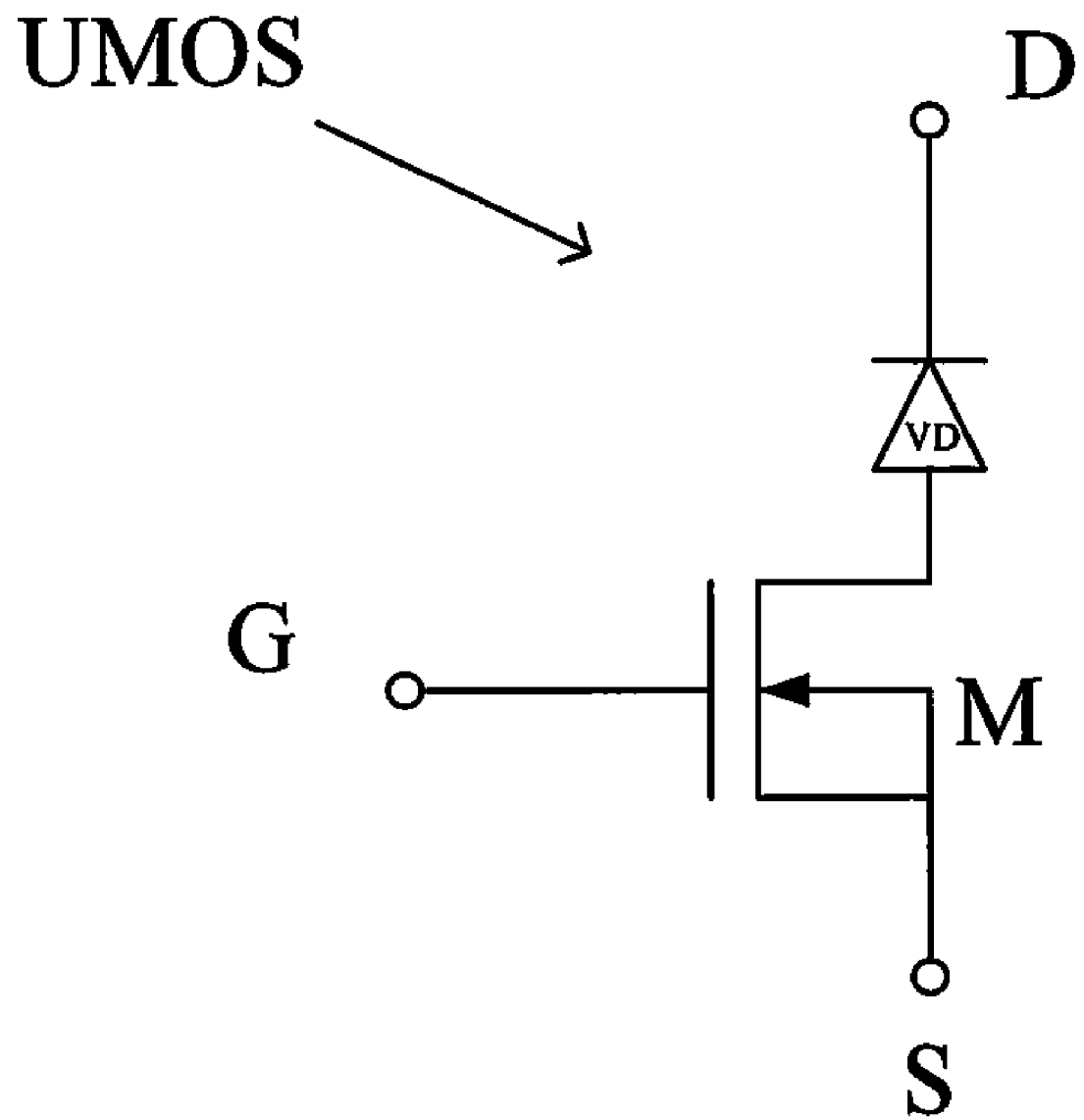
FIG. 3 is the equivalent circuit symbol of the unidirectional MOSFET.

To simplify the following circuit diagrams, the UMOS is denoted by an equivalent circuit symbol shown in FIG. 3. The equivalent circuit symbol includes the symbols of a MOSFET M and a virtual diode VD. The symbol of the MOSFET M represents that the channel of the UMOS is controlled by a voltage difference between the pan-gate G and the pan-source S; the symbol of the virtual diode VD symbolizes that the direction of the drain current is limited by the polarity of the virtual diode VD. In other words, the UMOS has the property of unidirectional conduction and may be but not limited to applications in synchronous rectifiers to detect the occurrence of a reverse current or a shoot-through current and fast turn off the channel of the MOSFET M.

Figure 4A:
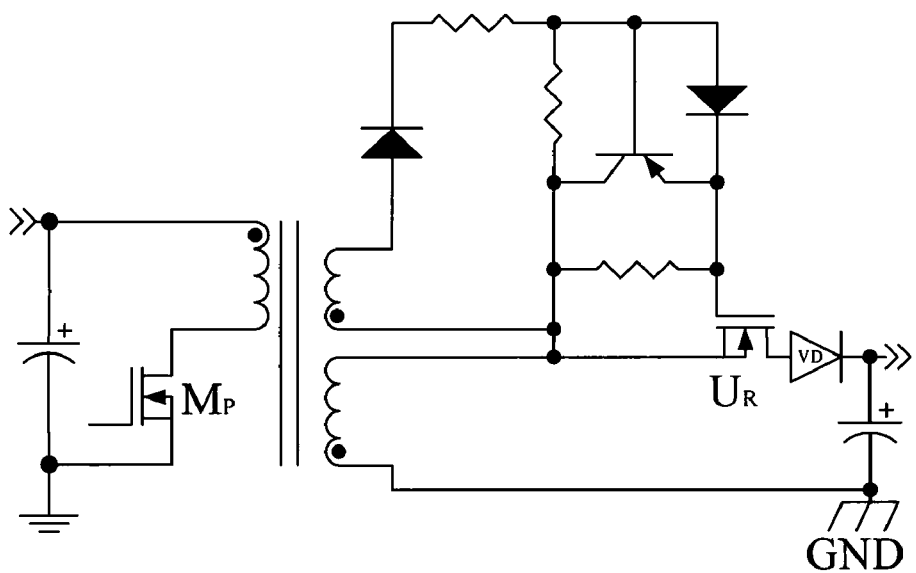
FIG. 4A and FIG. 4B are circuit diagrams of flyback converters with a self-driven synchronous rectifier realized with a unidirectional MOSFET.
Figure 4B:
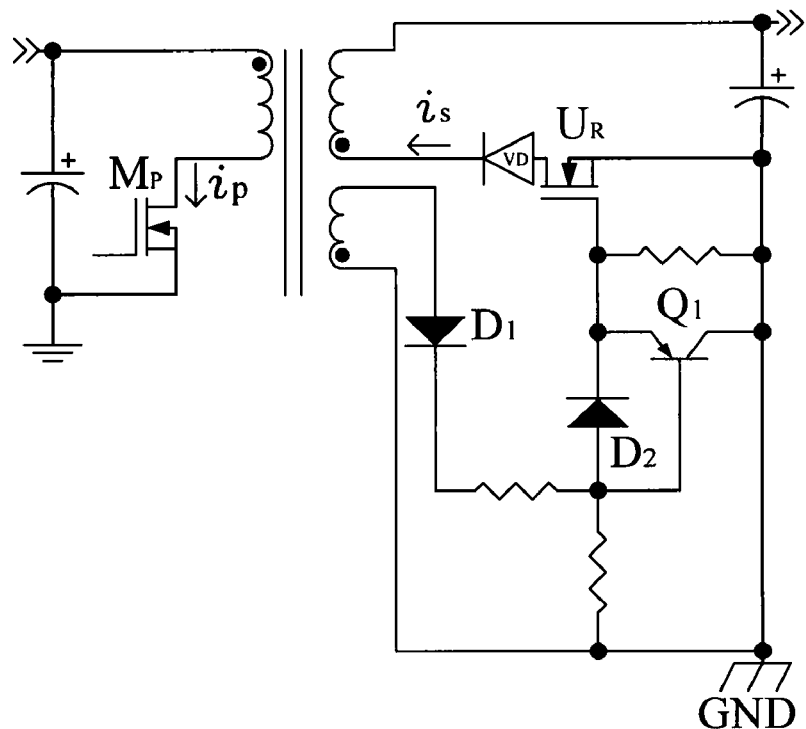
Figure 5A:
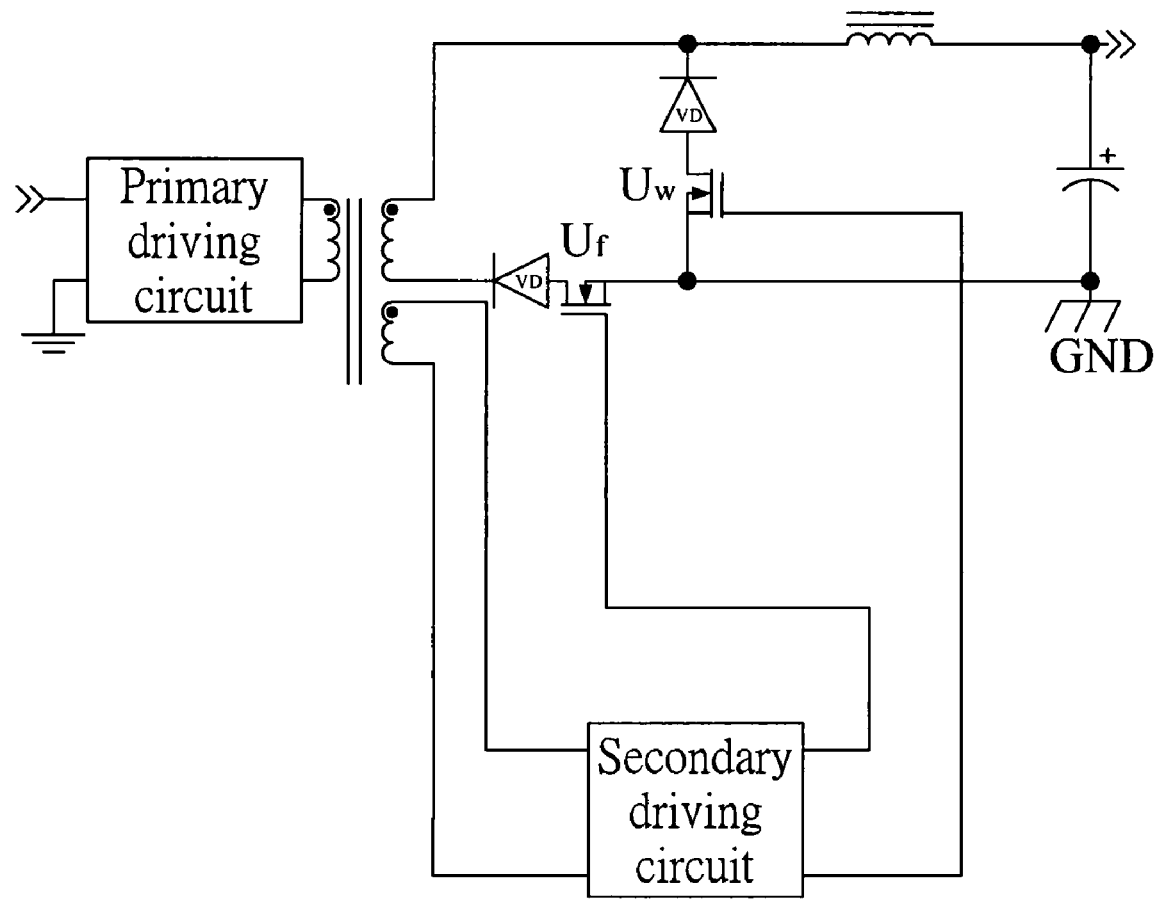
FIG. 5A and FIG. 5B are respectively circuit diagrams of a forward converter with a self-driven forward synchronous rectifier and a self-driven freewheeling synchronous rectifier, each of which is realized with a unidirectional MOSFET.
Figure 5B:
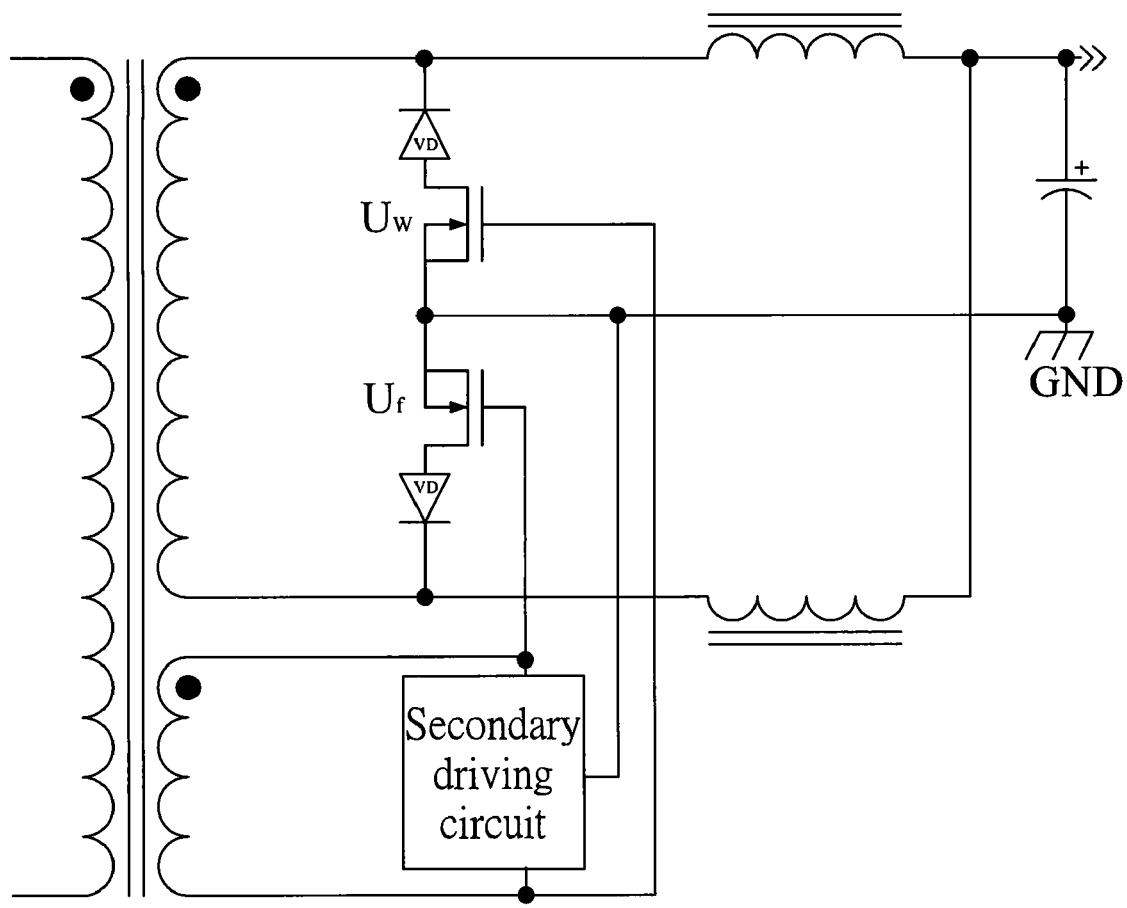

Below, some conventional power converters are taken as examples to illustrate the applications of a UMOS in synchronous rectifiers. FIG. 4A and FIG. 4B are the circuit diagrams of flyback converters with a self-driven synchronous rectifier $U_R$ realized with a UMOS. FIG. 5A and FIG. 5B are respectively the circuit diagrams of a forward converter with a self-driven forward synchronous rectifier $U_f$ and a self-driven freewheeling synchronous rectifier $U_w$, each of which is realized with a UMOS.

Figure 6:
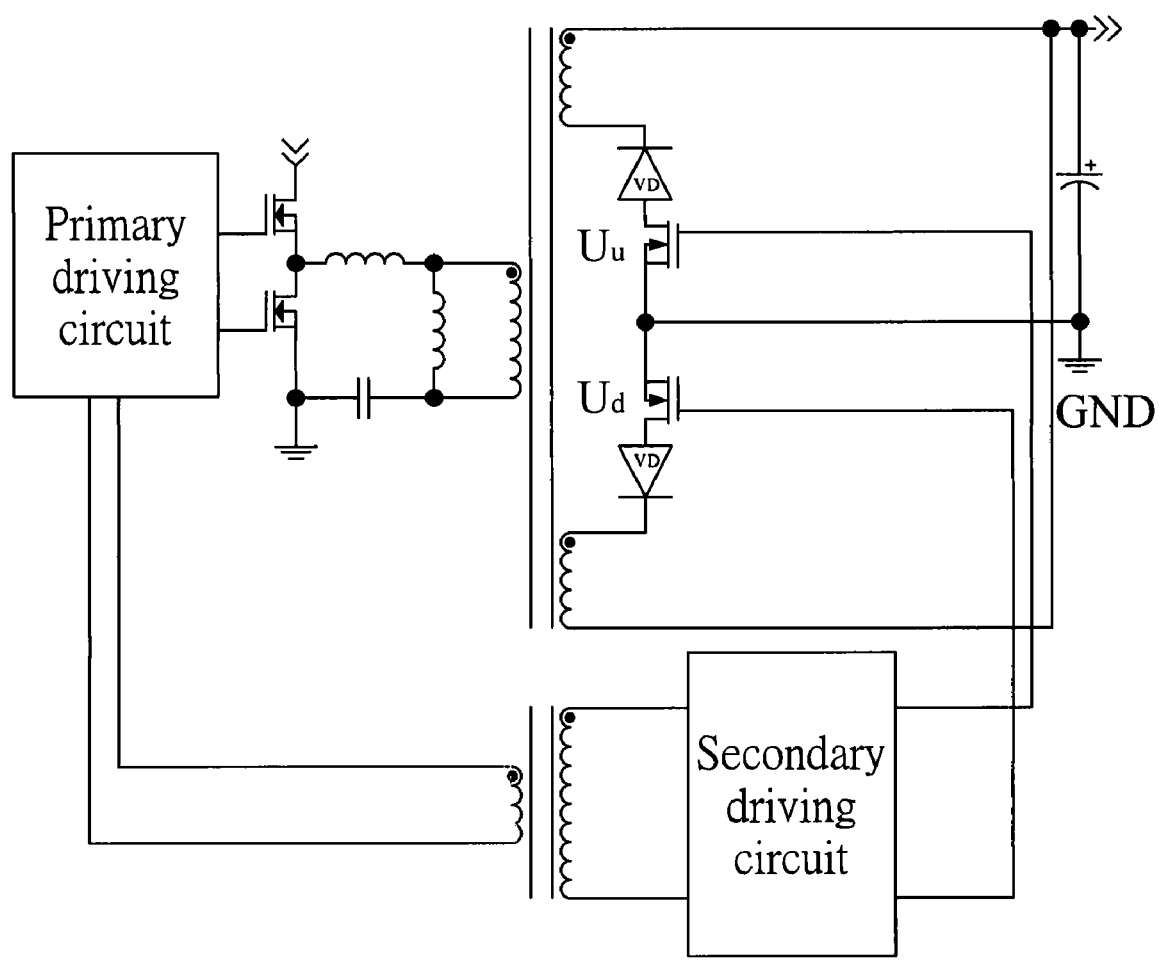
FIG. 6 is the circuit diagram of a half-bridge LLC resonant converter with self-driven synchronous rectifiers, each of which is realized with a unidirectional MOSFET.

FIG. 6 is the circuit diagram of a half-bridge LLC resonant converter with self-driven synchronous rectifiers $U_u$ and $U_d$, each of which is realized with a UMOS. Because the UMOS can detect the occurrence of a reverse current or a shoot-through current and fast turn off the channel of the MOSFET, the half-bridge LLC resonant converter with self-driven synchronous rectifiers realized with a UMOS does not need the constraint of the switching frequency being higher than the resonant frequency. In other words, the switching frequency may be lower than, equal to or higher than the resonant frequency.

For simplification, the virtue of a UMOS on self-driven synchronous rectifiers is illustrated in detail with FIG. 4B, where the flyback converter may operate under Discontinuous Conduction Mode (DCM) or Continuous Conduction Mode (CCM).

Discontinuous Conduction Mode (DCM)

Figure 7:
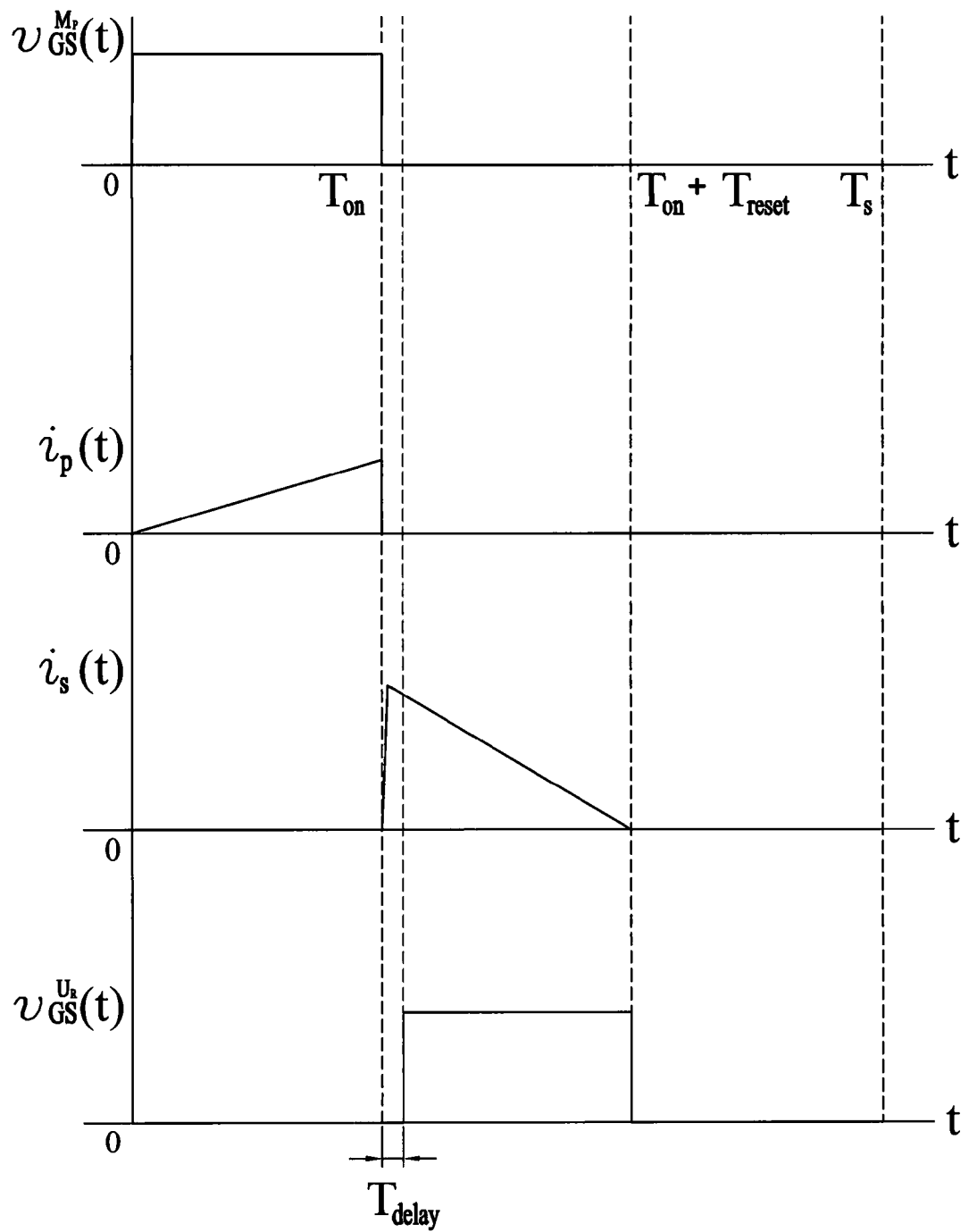
FIG. 7 and FIG. 8 are respectively the timing diagrams of the gate-source voltage of the primary switch transistor, the primary current, the secondary current and the gate-source voltage of the secondary self-driven synchronous rectifier under the discontinuous conduction mode and under the continuous conduction mode.

A timing diagram is shown in FIG. 7, where a switching period can be divided into three intervals: on-interval $0 \leq t < T_{on}$, reset-interval $T_{on} \leq t < T_{on}+T_{reset}$ and dead-interval $T_{on}+T_{reset} \leq t < T_s$; $v_{GS}^{M_p}(t)$ and $v_{GS}^{U_R}(t)$ are respectively the gate-source voltage of the primary switch transistor and the secondary synchronous rectifier; $i_p(t)$ and $i_s(t)$ are respectively the primary and the secondary currents.

Table I lists the on and off states of the primary switch transistor $M_p$, diodes $D_1$ and $D_2$, PNP bipolar transistor $Q_1$ as well as the secondary synchronous rectifier $U_R$.

TABLE I

| Interval | $M_p$ | $D_1$ | $D_2$ | $Q_1$ | $U_R$ |
|---|---|---|---|---|---|
| $0 \leq t < T_{on}$ | off→on | off | off | off | off |
| $T_{on} \leq t < T_{on} + T_{reset}$ | on→off | on | on | off | off→on |
| $T_{on} + T_{reset} \leq t < T_s$ | off | off | off | on→off | on→off |

The second row in Table I shows that at $t=T_{on}$ a cross conduction may exist between the primary switch transistor $M_p$ and the secondary synchronous rectifier $U_R$, a possibility to be discussed further. When the primary switch transistor $M_p$ transits from on to off, the secondary synchronous rectifier $U_R$ is still off. After the secondary current $i_s(t)$ flows through the body diode of the secondary synchronous rectifier $U_R$, the diodes $D_1$ and $D_2$, and the secondary synchronous rectifier $U_R$ begin to conduct. Because the secondary synchronous rectifier $U_R$ transits from off to on after the primary switch transistor $M_p$ turns off, at $t=T_{on}$ no cross conduction exists between the primary switch transistor $M_p$ and the secondary synchronous rectifier $U_R$.

Continuous Conduction Mode (CCM)

Figure 8:
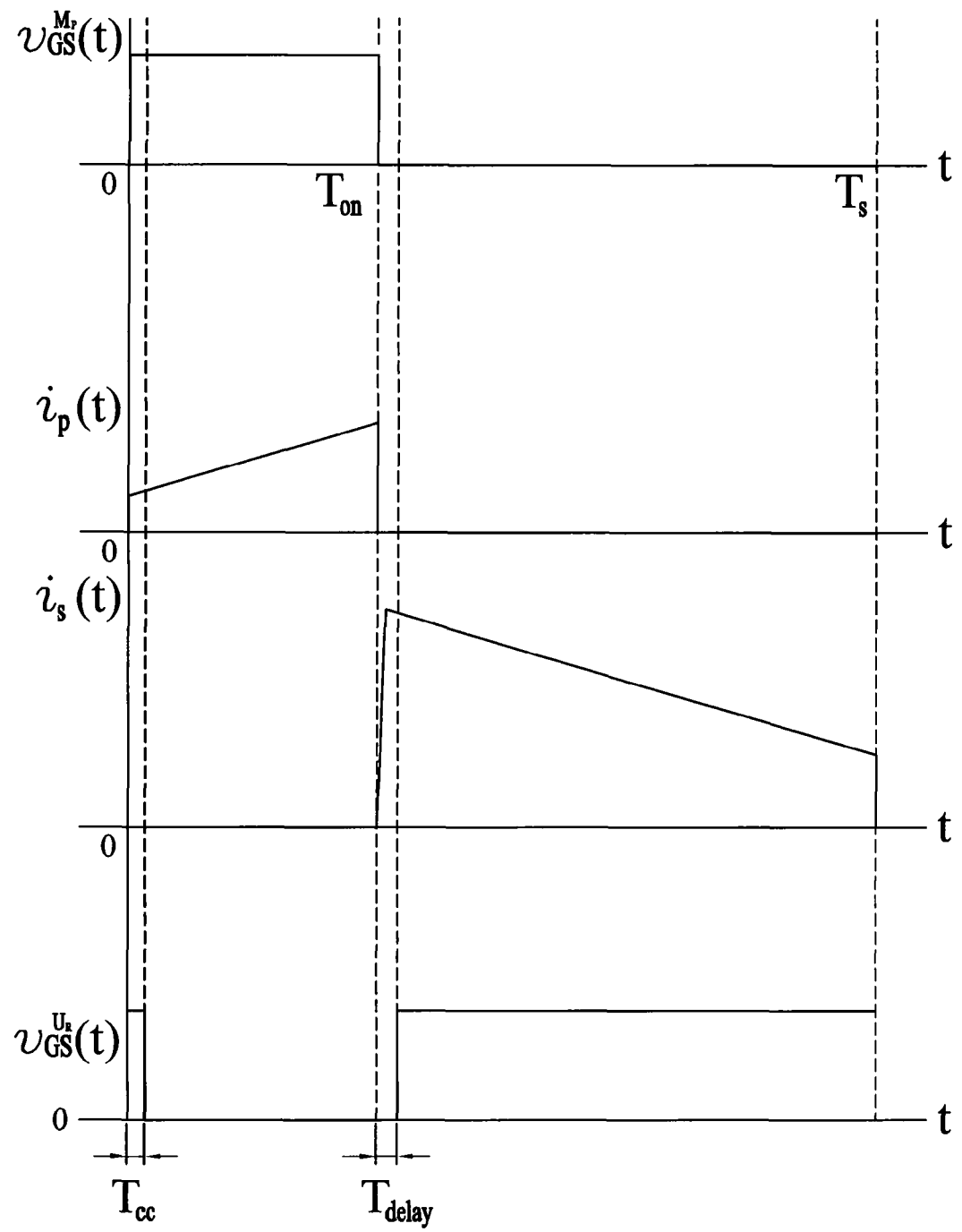

A timing diagram is shown in FIG. 8, where a switching period can be divided into two intervals: on-interval $0 \leq t < T_{on}$ and off-interval $T_{on} \leq t < T_{on}+T_s$.

Table II lists the on and off states of the primary switch transistor $M_p$, the diodes $D_1$ and $D_2$, the PNP bipolar junction transistor $Q_1$ as well as the secondary synchronous rectifier $U_R$.

TABLE II

| Interval | $M_p$ | $D_1$ | $D_2$ | $Q_1$ | $U_R$ |
|---|---|---|---|---|---|
| $0 \leq t < T_{on}$ | off→on | off | off | on→off | on→off |
| $T_{on} \leq t < T_{on} + T_s$ | on→off | on | on | off | off→on |

Because the second row in Table II is similar to the second row in Table I, at $t=T_{on}$ no cross conduction exists between the primary switch transistor $M_p$ and the secondary synchronous rectifier $U_R$. However, the first row in Table II shows that at $t=0$ a cross conduction may exist between the primary switch transistor $M_p$ and the secondary synchronous rectifier $U_R$, a possibility to be discussed further. When the primary switch transistor $M_p$ transits from off to on, the secondary synchronous rectifier $U_R$ is still on. After the diodes $D_1$ and $D_2$ turn off, the secondary synchronous rectifier $U_R$ transits from on to off. Because the secondary synchronous rectifier $U_R$ transits from on to off after the primary switch transistor $M_p$ turns on, at $t=0$ a cross conduction exists between the primary switch transistor $M_p$ and the secondary synchronous rectifier $U_R$. If a common NMOS is used as the self-driven synchronous rectifier, a huge shoot-through current $$i_{D(st)} = \frac{\frac{V_i N_s}{N_p} + V_o}{R_{DS(on)}}$$

will flow from drain to source through the channel, where $V_i$ is the input voltage; $N_p$ is the number of turns of the primary winding; $N_s$ is the number of turns of the secondary winding; $V_o$ is the output voltage; and $R_{DS(on)}$ is the small channel resistance. As a result, a shoot-through power dissipation $$P_{d(st)} = \frac{i_{D(st)}^2 R_{DS(on)} T_{CC}}{T_s}$$

may damage the NMOS, where $T_{CC}$ is the cross conduction interval and $T_S$ is the switching period. In view of this, the present invention proposes a UMOS to be used as the self-driven synchronous rectifier. Since the current detection circuit of a UMOS can immediately detect the occurrence of a tiny shoot-through current and turn off the channel to stop the shoot-through current, the UMOS can exempt itself from being damaged by a large shoot-through current.

During the delay interval $T_{delay}$ when the primary switch transistor $M_p$ transits from on to off and the secondary synchronous rectifier $U_R$ transits from off to on, the secondary current $i_s(t)$ flows through the body diode of the MOSFET M. Since the body diode has a higher forward voltage drop and the secondary current $i_s(t)$ approaches its peak value, the UMOS has a larger body diode conduction loss in this specific application. If the UMOS is replaced with an e-UMOS, the diode $D^*_U$ can bypass the body diode to further reduce the body diode conduction loss.

It is emphatically noted that applications of a UMOS/e-UMOS in synchronous rectifiers can be but not limited to flyback converters, forward converters and half-bridge LLC resonant converters.

While the invention has been described in terms of what are presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A unidirectional metal oxide field effect transistor comprising:
    a pan-gate, a pan-drain and a pan-source;
    a MOSFET with a gate, a drain and a source;
    a current detection circuit with a first input, a second input and an output; and
    a fast turn-off circuit with a first input, a second input, a first output and a second output, wherein
    said MOSFET and said current detection circuit are connected in series between said pan-drain and said pan-source and provides a pan-source detection or a pan-drain detection;
        for said pan-source detection, said MOSFET is connected between said pan-drain and said second input of said current detection circuit, and said first input of said current detection circuit is connected to said pan-source;

for said pan-drain detection, said pan-drain is connected to said second input of said current detection circuit, and said MOSFET is connected between said first input of said current detection circuit and said pan-source; and said first input, said second input, said first output and said second output of said fast turn-off circuit are respectively connected to said output of said current detection circuit, said pan-gate, said gate of said MOSFET and said source of said MOSFET.

2. The unidirectional metal oxide field effect transistor according to claim 1 further comprising a diode, wherein an anode and a cathode of said diode are respectively connected between said pan-source and said pan-drain, and is referred to as an enhanced unidirectional metal oxide field effect transistor.

3. The unidirectional metal oxide field effect transistor according to claim 1, wherein said MOSFET is an N-channel MOSFET.

4. The unidirectional metal oxide field effect transistor according to claim 1, wherein said MOSFET is a P-channel MOSFET.

5. The unidirectional metal oxide field effect transistor according to claim 1, wherein said current detection circuit comprises a current transformer and a diode, a positive pole and a negative pole of a primary winding of said current transformer are respectively used as said first input and said second input of said current detection circuit; a positive pole and a negative pole of a secondary winding of said current transformer are respectively connected to an anode and a cathode of said diode, the cathode of said diode is used as said output of said current detection circuit, and the anode of said diode is connected to said source of said MOSFET.

6. The unidirectional metal oxide field effect transistor according to claim 1, wherein said fast turn-off circuit comprises a Darlington transistor, a base resistor and a collector resistor; a base of said Darlington transistor is connected to a terminal of said base resistor, the other terminal of said base resistor is connected to said first input of said fast turn-off circuit, a collector of said Darlington transistor is connected to a terminal of said collector resistor, the other terminal of said collector resistor is connected to said second input of said fast turn-off circuit, and said collector and an emitter of said Darlington transistor are used as said first output and said second output of said fast turn-off circuit to be respectively connected to said gate and said source of said MOSFET.

7. A flyback converter with a self-driven synchronous rectifier, wherein said self-driven synchronous rectifier is a unidirectional metal oxide field effect transistor according to claim 1 or an enhanced unidirectional metal oxide field effect transistor according to claim 2.

8. A forward converter with a self-driven forward synchronous rectifier and a self-driven freewheeling synchronous rectifier, wherein each of said self-driven forward synchronous rectifier and said self-driven freewheeling synchronous rectifier is a unidirectional metal oxide field effect transistor according to claim 1 or an enhanced unidirectional metal oxide field effect transistor according to claim 2.

9. A half-bridge LLC resonant converter with self-driven synchronous rectifiers, wherein each of said self-driven synchronous rectifiers is a unidirectional metal oxide field effect transistor according to claim 1 or an enhanced unidirectional metal oxide field effect transistor according to claim 2.

* * * * *